United States Patent
Hitotsumatsu et al.

(10) Patent No.: US 11,477,884 B2
(45) Date of Patent: Oct. 18, 2022

(54) COVER FILM FOR FLEXIBLE PRINTED CIRCUIT BOARD AND FLEXIBLE PRINTED CIRCUIT BOARD

(71) Applicant: SUMITOMO ELECTRIC PRINTED CIRCUITS, INC., Shiga (JP)

(72) Inventors: Takuma Hitotsumatsu, Shiga (JP); Hideki Kashihara, Shiga (JP)

(73) Assignee: SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 17/040,706

(22) PCT Filed: Apr. 3, 2019

(86) PCT No.: PCT/JP2019/014722
§ 371 (c)(1),
(2) Date: Sep. 23, 2020

(87) PCT Pub. No.: WO2019/194208
PCT Pub. Date: Oct. 10, 2019

(65) Prior Publication Data
US 2021/0014968 A1    Jan. 14, 2021

(30) Foreign Application Priority Data
Apr. 4, 2018    (JP) .............................. JP2018-072403

(51) Int. Cl.
*H05K 1/00*    (2006.01)
*H05K 1/02*    (2006.01)
(Continued)

(52) U.S. Cl.
CPC .......... *H05K 1/0393* (2013.01); *H05K 3/207* (2013.01); *H05K 3/287* (2013.01)

(58) Field of Classification Search
CPC .. H05K 1/00; H05K 1/02; H05K 1/03; H05K 1/05; H05K 1/11; H05K 1/18; H05K 3/00; H05K 3/20; H05K 3/36; H05K 3/38; H05K 3/42; H05K 3/44; H05K 1/09; H05K 3/28; H05K 3/386
USPC ....... 174/254, 250, 258, 259, 262, 264, 252; 428/44, 59, 73, 75, 141, 166, 170, 183, 428/195.1, 209, 210, 215, 317.3, 327, 428/336, 344, 345, 353, 418, 40.1, 216;
(Continued)

(56) References Cited

U.S. PATENT DOCUMENTS 4,081,414 A * 3/1978 Abe ........................ C09J 109/00
524/273
4,269,712 A * 5/1981 Hornby .................. B01D 63/02
210/321.8
(Continued)

FOREIGN PATENT DOCUMENTS

JP    2006-285178    10/2006
JP    2008-205125    9/2008

*Primary Examiner* — Xiaoliang Chen
(74) *Attorney, Agent, or Firm* — IPUSA, PLLC

(57) ABSTRACT

According to one aspect of the present disclosure, a cover film for a flexible printed circuit board includes: an adhesive layer; and a protective layer that is layered on a surface of the adhesive layer, wherein a lamination temperature range in which a ratio of a viscosity of the protective layer to a viscosity of the adhesive layer is five times or more is present within a temperature range of 50° C. or more and 150° C. or less.

3 Claims, 1 Drawing Sheet

(51) Int. Cl.

| | | |
|---|---|---|
| *H05K 1/03* | (2006.01) | |
| *H05K 1/05* | (2006.01) | |
| *H05K 1/11* | (2006.01) | |
| *H05K 1/18* | (2006.01) | |
| *H05K 3/00* | (2006.01) | |
| *H05K 3/20* | (2006.01) | |
| *H05K 3/36* | (2006.01) | |
| *H05K 3/38* | (2006.01) | |
| *H05K 3/42* | (2006.01) | |
| *H05K 3/44* | (2006.01) | |
| *C08G 73/10* | (2006.01) | |
| *C09D 5/34* | (2006.01) | |
| *C09D 179/08* | (2006.01) | |
| *C09J 179/08* | (2006.01) | |
| *H05K 3/28* | (2006.01) | |

(58) Field of Classification Search
 USPC ........ 438/108, 114, 455, 496, 620; 156/182,
  156/235, 248, 330, 583.1; 257/773;
  361/424, 749
 See application file for complete search history.

(56) References Cited

U.S. PATENT DOCUMENTS

| | | | | |
|---|---|---|---|---|
| 4,290,936 A * | 9/1981 | Sasaki | C08G 73/1028 | 524/879 |
| 4,302,572 A * | 11/1981 | Locatelli | C08G 18/04 | 528/73 |
| 4,323,453 A * | 4/1982 | Zampini | B01D 63/023 | 210/321.61 |
| 4,789,699 A * | 12/1988 | Kieffer | B32B 7/12 | 524/271 |
| 5,252,703 A * | 10/1993 | Nakajima | C08G 73/106 | 525/423 |
| 5,286,539 A * | 2/1994 | Kusuki | B01D 71/64 | 210/500.1 |
| 5,480,603 A * | 1/1996 | Lopez | B29B 11/16 | 264/131 |
| 5,914,157 A * | 6/1999 | Munson | C09J 121/00 | 427/516 |
| 6,174,401 B1 * | 1/2001 | Ogura | B41M 5/0256 | 156/235 |
| 6,329,494 B1 * | 12/2001 | Arai | C07C 69/76 | 528/170 |
| 6,624,504 B1 * | 9/2003 | Inoue | H01L 23/293 | 257/668 |
| 6,770,547 B1 * | 8/2004 | Inoue | H01L 21/563 | 438/496 |
| 6,822,317 B1 * | 11/2004 | Inoue | H01L 23/293 | 257/668 |
| 7,070,670 B2 * | 7/2006 | Tomiyama | C09J 163/00 | 156/248 |
| 7,820,742 B2 * | 10/2010 | Ichiroku | C09J 183/10 | 523/466 |
| 8,309,853 B2 | 11/2012 | Oka et al. | | |
| 8,999,494 B2 * | 4/2015 | Derks | C08G 69/44 | 428/195.1 |
| 9,309,381 B2 * | 4/2016 | Patel | C08G 59/56 | |
| 2001/0008794 A1 * | 7/2001 | Akagawa | H01L 25/50 | 438/620 |
| 2001/0010627 A1 * | 8/2001 | Akagawa | H01L 24/24 | 361/761 |
| 2001/0038396 A1 * | 11/2001 | Imanaka | B41J 2/04543 | 347/7 |
| 2002/0004982 A1 * | 1/2002 | Haze | H05K 3/385 | 29/852 |
| 2002/0020909 A1 * | 2/2002 | Wakashima | H01L 23/49866 | 257/697 |
| 2002/0053730 A1 * | 5/2002 | Mashino | H01L 25/105 | 257/690 |
| 2002/0094639 A1 * | 7/2002 | Reddy | G06K 19/07749 | 438/257 |
| 2002/0101304 A1 * | 8/2002 | Onishi | H03H 9/1085 | 333/193 |
| 2002/0181157 A1 * | 12/2002 | Serizawa | G11B 5/486 | 360/245.9 |
| 2003/0080409 A1 * | 5/2003 | Nakamura | H01L 23/49822 | 257/700 |
| 2003/0089519 A1 * | 5/2003 | Okada | H05K 1/09 | 174/254 |
| 2003/0107129 A1 * | 6/2003 | Ono | H01L 24/49 | 257/734 |
| 2003/0173707 A1 * | 9/2003 | Becker | H01R 4/72 | 264/272.11 |
| 2003/0203174 A1 * | 10/2003 | McCarthy | H05K 3/4626 | 428/209 |
| 2003/0232486 A1 * | 12/2003 | Mashino | H01L 25/0657 | 438/455 |
| 2004/0048978 A1 * | 3/2004 | Okada | C08F 283/04 | 524/606 |
| 2005/0013088 A1 * | 1/2005 | Horikawa | H01L 21/6835 | 361/303 |
| 2005/0143552 A1 * | 6/2005 | Ikeda | C08G 18/10 | 528/49 |
| 2006/0093799 A1 * | 5/2006 | Miyake | B32B 15/08 | 428/209 |
| 2006/0138671 A1 * | 6/2006 | Watanabe | H01L 24/13 | 257/773 |
| 2006/0164817 A1 * | 7/2006 | Yoshida | H01L 31/02325 | 257/E31.127 |
| 2006/0272853 A1 * | 12/2006 | Muramatsu | H01L 21/4857 | 174/262 |
| 2007/0074896 A1 * | 4/2007 | Tanaka | H05K 1/0353 | 174/259 |
| 2007/0088145 A1 * | 4/2007 | Mgaya | C09J 5/00 | 528/44 |
| 2008/0017029 A1 * | 1/2008 | Kase | B01D 53/22 | 95/50 |
| 2008/0068780 A1 * | 3/2008 | Shioga | H01G 4/008 | 361/524 |
| 2008/0090075 A1 * | 4/2008 | Kondo | C09J 133/02 | 428/344 |
| 2008/0230261 A1 * | 9/2008 | Tanaka | C08L 63/00 | 174/258 |
| 2008/0237840 A1 * | 10/2008 | Alcoe | H01L 23/42 | 257/706 |
| 2008/0286562 A1 * | 11/2008 | Toyoda | C09J 163/00 | 428/327 |
| 2009/0093088 A1 * | 4/2009 | Ano | H01L 23/3121 | 438/114 |
| 2009/0126975 A1 * | 5/2009 | Kondo | H05K 3/4626 | 174/250 |
| 2010/0300708 A1 * | 12/2010 | Raphael | A61M 16/0875 | 128/207.18 |
| 2011/0143092 A1 * | 6/2011 | Asai | C08J 7/043 | 428/141 |
| 2011/0235984 A1 * | 9/2011 | Dowd | G02B 6/4436 | 29/458 |
| 2012/0119328 A1 * | 5/2012 | Nakaiso | H01G 4/12 | 257/532 |
| 2012/0263946 A1 * | 10/2012 | Mitsukura | H01L 21/67132 | 428/345 |
| 2013/0011657 A1 * | 1/2013 | Kato | C09J 7/26 | 428/317.3 |
| 2013/0031980 A1 * | 2/2013 | Sako | B06B 1/0292 | 156/60 |
| 2013/0228360 A1 * | 9/2013 | Shirafuji | H05K 3/0082 | 174/250 |
| 2014/0268780 A1 * | 9/2014 | Wang | F21V 19/003 | 362/249.06 |
| 2015/0050778 A1 * | 2/2015 | Asahi | H01L 24/83 | 438/108 |
| 2015/0174791 A1 * | 6/2015 | Dauphin | B32B 5/10 | 428/215 |
| 2016/0157343 A1 * | 6/2016 | Abe | H05K 1/0393 | 361/749 |

(56) References Cited

U.S. PATENT DOCUMENTS

| | | | |
|---|---|---|---|
| 2016/0198570 A1* | 7/2016 | Yonezawa | C09J 183/10 |
| | | | 428/209 |
| 2016/0245997 A1* | 8/2016 | Terada | G02B 6/428 |
| 2016/0250830 A1* | 9/2016 | Kiya | H05K 3/20 |
| | | | 174/258 |
| 2017/0095768 A1* | 4/2017 | Nakamura | C08G 73/1042 |
| 2019/0244927 A1* | 8/2019 | Lin | C09D 5/34 |
| 2019/0337278 A1* | 11/2019 | Rheinegger | B29C 66/61 |

* cited by examiner

COVER FILM FOR FLEXIBLE PRINTED CIRCUIT BOARD AND FLEXIBLE PRINTED CIRCUIT BOARD

TECHNICAL FIELD

The present disclosure relates to a cover film for a flexible printed circuit board and a flexible printed circuit board. The present application is based on and claims priority to Japanese Patent Application No. 2018-072403, filed on Apr. 4, 2018, the entire contents of the Japanese Patent Application being hereby incorporated herein by reference.

BACKGROUND ART

In recent years, along with the reduction in size and weight of electronic devices, electronic components, such as planar coil elements, have been reduced in size by a configuration using a conductive pattern and mounted on a flexible printed circuit board.

Such electronic components mounted on a flexible printed circuit board are covered and protected, for example, by a coverlay (see, for example, Japanese Laid-open Patent Publication No. 2008-205125). The coverlay is composed of a thin adhesive layer that is layered on a conductive pattern and a resin layer that is layered on the adhesive layer to cover the conductive pattern. The adhesive layer and the resin layer are flexible and adhere to the conductive pattern so that the electronic components are covered and protected mainly by the resin layer.

PRIOR ART DOCUMENT

Patent Document

[Patent Document 1] Japanese Laid-open Patent Publication No. 2008-205125

SUMMARY OF THE INVENTION

According to one aspect of the present disclosure, a cover film for a flexible printed circuit board includes: an adhesive layer; and a protective layer that is layered on a surface of the adhesive layer, wherein a lamination temperature range in which a ratio of a viscosity of the protective layer to a viscosity of the adhesive layer is five times or more is present within a temperature range of 50° C. or more and 150° C. or less.

EMBODIMENT FOR CARRYING OUT THE INVENTION

Figure 1:
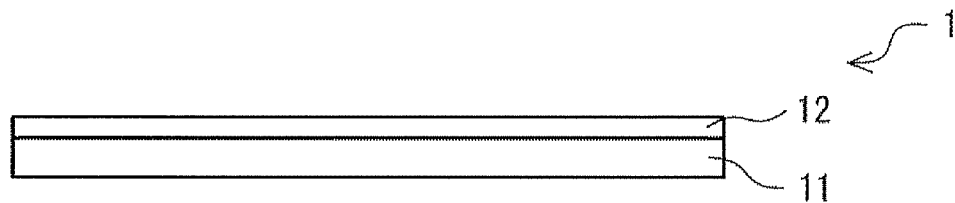
FIG. 1 is a schematic side view of a cover film for a flexible printed circuit board according to one embodiment of the present disclosure.

Problem to be Solved by the Present Disclosure

As electronic components that are mounted on a flexible printed circuit board are reduced in size, the aspect ratio of a conductive pattern (circuit wiring) constituting the electronic components increases. Thus, by increasing the aspect ratio of the circuit wiring, while suppressing an increase in resistance, it is possible to reduce the circuit area in a plan view. In electronic components reduced in size by increasing the aspect ratio, voids between the conductive pattern constituting the electronic components are deep. Therefore, when performing lamination by a conventional coverlay as described above, the voids cannot be filled, air bubbles occur, and it is difficult to sufficiently cover the electronic component top surface. To fill the voids, a method is considered to decrease the viscosity of a resin layer at the time of heating so that the resin flows into the voids at the time of performing lamination. However, in such a method, it is difficult to control the film thickness, and the top portion of electronic components may protrude from a coverlay, resulting in insufficient protection by the coverlay. Thus, for a conventional coverlay, it is difficult to achieve both covering the electronic component top surface and filling voids between the electronic components.

In view of the above, the present disclosure has an object to provide a cover film for a flexible printed circuit board that can both achieve covering an electronic component top surface and filling voids between electronic components and provide a flexible printed circuit board using the cover film for a flexible printed circuit board.

Effect of the Present Disclosure

A cover film for a flexible printed circuit board according to the present disclosure can both cover an electronic component top surface and fill voids between electronic components. Accordingly, by using the cover film for a flexible printed circuit board, even for a flexible printed circuit board on which electronic components having a high aspect ratio of a circuit wiring are mounted, it is possible to preferably protect the circuit.

Description of Embodiments of the Present Disclosure

According to one aspect of the present disclosure, a cover film for a flexible printed circuit board includes: an adhesive layer; and a protective layer that is layered on a surface of the adhesive layer, wherein a lamination temperature range in which a ratio of a viscosity of the protective layer to a viscosity of the adhesive layer is five times or more is present within a temperature range of 50° C. or more and 150° C. or less.

In the cover film for a flexible printed circuit board, the lamination temperature range, in which the ratio of the viscosity of the protective layer to the viscosity of the adhesive layer is five times or more, is present within the above temperature range. In this lamination temperature range, the viscosity of the adhesive layer can be reduced while the viscosity of the protective layer of the cover film for a flexible printed circuit board is kept relatively high. Therefore, by using the cover film for a flexible printed circuit board in the lamination temperature range, voids between the electronic components are easily filled with the adhesive layer with a low viscosity, and the protective layer with a high viscosity remains on the top portion of the electronic components while covering the electronic components. Therefore, it is possible to achieve both covering the electronic component top surface and filling the voids between the electronic components.

It is preferable that the lamination temperature range includes a temperature range of 70° C. or more and 90° C. or less. By the lamination temperature range including the temperature range described above, even when a flexible printed circuit board covered by the cover film for a flexible printed circuit board is used in a high temperature environment, it is possible to prevent the cover film for a flexible printed circuit board from softening and to prevent the electronic components from being thermally damaged at the time of lamination.

It is preferable that the adhesive layer and the protective layer contain a photosensitive material as a main component. By using, as the main component of the adhesive layer and the protective layer, a photosensitive material, it is possible to selectively cover the electronic component top surface and fill the voids between the electronic components.

According to one aspect of the present disclosure, a flexible printed circuit board includes: an insulating base film; and a conductive pattern that is layered on one surface side of the base film, wherein one surface of the base film or the conductive pattern is covered by the cover film for a flexible printed circuit board.

Also, in the flexible printed circuit board, electronic components that are configured by the conductive pattern are covered by the cover film for a flexible printed circuit board according to the present disclosure. Therefore, even for the flexible printed circuit board on which electronic components having a high aspect ratio of a circuit wiring are mounted, it is possible to preferably protect the circuit.

Here, the "main component" means the component with the highest content and means, for example, the component of which the content is greater than or equal to 50% by mass.

Details of Embodiments of the Present Disclosure

In the following, a cover film for a flexible printed circuit board and a flexible printed circuit board according to the present disclosure will be described in detail with reference to the drawings.

<Cover Film for Flexible Printed Circuit Board>

As illustrated in FIG. 1, a cover film 1 for a flexible printed circuit board according to an embodiment of the present disclosure includes an adhesive layer 11 and a protective layer 12 that is layered on the surface of the adhesive layer 11.

The shape of the cover film 1 for a flexible printed circuit board in plan view is not particularly limited as long as it can protect electronic components mounted on the flexible printed circuit board, and may be, for example, a rectangular shape or a circular shape. Also, the size of the cover film 1 for a flexible printed circuit board in plan view is not particularly limited as long as it can protect electronic components mounted on the flexible printed circuit board.

The average thickness of the adhesive layer 11 is appropriately determined in accordance with the average thickness of a conductive pattern that constitutes electronic components. The lower limit of the average thickness of the adhesive layer 11 is preferably 3 µm and is more preferably 40 µm. On the other hand, the upper limit of the average thickness of the adhesive layer 11 is preferably 100 µm and is more preferably 60 µm. When the average thickness of the adhesive layer 11 is less than the lower limit as described above, voids between the electronic components may not be sufficiently filled. Conversely, when the average thickness of the adhesive layer 11 exceeds the upper limit as described above, the average thickness of the flexible printed circuit board covered by the cover film 1 for a flexible printed circuit board may increase, and a demand for thickness reduction may not be satisfied.

The lower limit of the average thickness of the protective layer 12 is preferably 2 µm and is more preferably 3 µm. On the other hand, the upper limit of the average thickness of the protective layer 12 is preferably 10 µm and is more preferably 7 µm. When the average thickness of the protective layer 12 is less than the lower limit as described above, the strength of the protective layer 12 may be insufficient and covering of the electronic components may be insufficient. Conversely, when the average thickness of the protective layer 12 exceeds the upper limit as described above, the average thickness of the flexible printed circuit board covered by the cover film 1 for a flexible printed circuit board may increase, and a demand for thickness reduction may not be satisfied.

Examples of the main component of the material that forms the adhesive layer 11 can include acid-modified oligomers including a carboxyl group (—COOH) and a photocurable unsaturated functional group, polyimide-based resins, photopolymerizable monomers including two or more photocurable unsaturated functional groups, thermosetting binders including a thermosetting functional group, resin compositions including a photoinitiator and having photocurable property and a thermosetting property, and the like.

Examples of the above photopolymerizable monomers can include, for example, a hydroxyl group-containing polyfunctional acrylate-based compound, a water-soluble polyfunctional acrylate-based compound, a polyfunctional polyester acrylate-based compound of a polyhydric alcohol, an acrylate-based compound of ethylene oxide adduct of polyphenol or polyfunctional alcohol, an acrylate-based compound of propylene oxide adduct of polyphenol or polyfunctional alcohol, a polyfunctional or monofunctional polyurethane acrylate-based compound, an epoxy-acrylate-based compound, a urethane-based resin component, a caprolactone-modified acrylate-based compound, a photosensitive (meth)acrylate-based compound, and the like. These photopolymerizable monomers may be used alone or two or more kinds of photopolymerizable monomers may be used in combination.

Examples of the above photoinitiator can include, for example, a benzoin-based compound, an acetophenone-based compound, an anthraquinone-based compound, a thioxanthone compound, a ketal compound, a benzophenone-based compound, an α-aminoacetophenone compound, an acylphosphine oxide compound, an oxime ester compound, a biimidazole-based compound, a triazine-based compound, and the like. These photoinitiators may be used alone or two or more kinds of photoinitiators may be used in combination with.

Examples of the thermosetting functional group can include, for example, an epoxy group, an oxetanyl group, an imide group, an amide group, a cyclic ether group, a cyclic thioether group, and the like. Two or more kinds of these functional groups may be present in one molecule, or thermosetting binders including different functional groups may be used in combination.

Among the materials for the main component to form the adhesive layer 11 described above, a thermosetting binder including a thermosetting functional group is preferable and, a thermosetting binder including an epoxy group as a thermosetting functional group is particularly preferable, from the viewpoint of the viscosity in the temperature range of 70° C. or more and 90° C. or less.

Examples of the main component of the protective layer 12 include polyimide, polyethylene terephthalate, a fluoropolymer, and the like. Among these, it is preferable that polyimide be the main component from the viewpoint of the viscosity in the temperature range of 70° C. or more and 90° C. or less.

Also, it is preferable that the main component of the adhesive layer 11 and the protective layer 12 is a photosensitive material. By using, as the main component of the adhesive layer 11 and the protective layer 12, a photosensitive material, the cover film 1 for a flexible printed circuit board can be easily patterned. For this reason, by the cover film 1 for a flexible printed circuit board, it is possible to selectively cover the electronic component top surface and fill the voids between the electronic components, for the electronic components located at a specific location.

Figure 2:
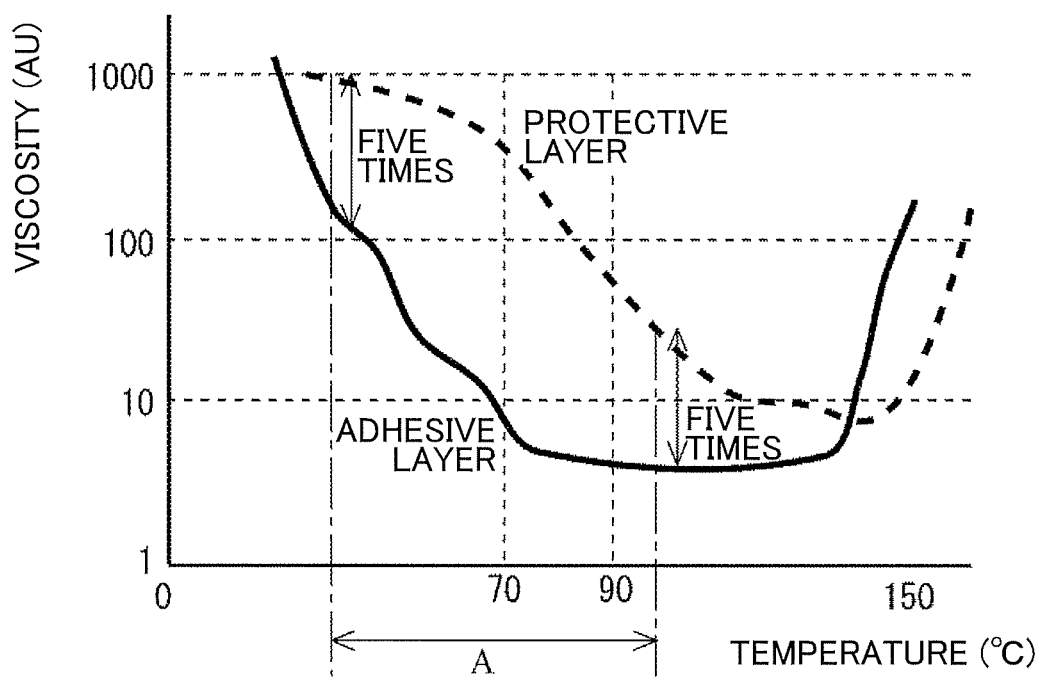
FIG. 2 is a schematic graph illustrating a temperature dependence of the viscosity of an adhesive layer and a protective layer.

The viscosities of the adhesive layer 11 and the protective layer 12 are measured based on, for example, JIS-K7117-1:1999 "Plastics—Resins In The Liquid State Or As Emulsions Or Dispersions—Determination Of Apparent Viscosity By The Brookfield Test Method", and each has a temperature dependence as illustrated in FIG. 2. In the cover film 1 for a flexible printed circuit board, the lamination temperature range A (temperature range of A in FIG. 2) in which the ratio of the viscosity of the protective layer 12 to the viscosity of the adhesive layer 11 is five times or more is present within the temperature range of 50° C. or more and 150° C. or less. It should be noted that in FIG. 2, the longitudinal axis is a logarithmic scale and the viscosity is in an arbitrary unit (AU: Arbitrary Unit).

It is preferable that the lamination temperature range A of the cover film 1 for a flexible printed circuit board includes a temperature range of 70° C. or more and 90° C. or less as illustrated in FIG. 2. Since the lamination temperature range A includes the temperature range, even when the flexible printed circuit board covered by the cover film 1 for a flexible printed circuit board is used in the high temperature environment, it is possible to prevent the cover film 1 for a flexible printed circuit board from softening, and at the same time, it is possible to prevent thermal damage to the electronic components at the time of lamination. By the lamination temperature range A including the temperature range described above, even when the flexible printed circuit board covered by the cover film 1 for a flexible printed circuit board is used in a high temperature environment, it is possible to prevent the cover film 1 for a flexible printed circuit board from softening and to prevent the electronic components from being thermally damaged at the time of lamination.

The lower limit of the temperature range of the lamination temperature range A is preferably 30° C. and is more preferably 50° C. When the temperature range of the lamination temperature range A is less than the lower limit as described above, the temperature range where lamination by the cover film 1 for a flexible printed circuit board can be effectively performed is narrow, and therefore the cost of the temperature control or the like may increase. On the other hand, the upper limit of the temperature range of the lamination temperature range A is not particularly limited, and may be, for example, 100° C.

The maximum value of the ratio of the viscosity of the protective layer 12 to the viscosity of the adhesive layer 11 in the lamination temperature range A is preferably 200 times or less, and is more preferably 100 times or less. When the above described ratio of the viscosity exceeds the upper limit as described above, there is a temperature at which the viscosity of the adhesive layer 11 is extremely low or the viscosity of the protective layer 12 is extremely high when performing lamination at the time of heating, and the lamination may be difficult. It should be noted that the minimum value of the ratio of the viscosity of the protective layer 12 to the viscosity of the adhesive layer 11 in the lamination temperature area A is five times with respect to the lamination temperature range A.

The cover film 1 for a flexible printed circuit board retains the protective layer 12 with a high viscosity over the top portion of the electronic components while covering the electronic components and fills the voids between the electronic components with the adhesive layer 11 with a low viscosity. In order to efficiently cover the electronic component top surface and fill the voids between the electronic components, there is an appropriate viscosity T (dPa·s), and the lamination temperature range A preferably includes a temperature range in which the viscosity of the protective layer 12 is greater than or equal to T and the viscosity of the adhesive layer 11 is less than T (hereinafter, referred to as the "preferable lamination temperature range"). It should be noted that the appropriate viscosity T is determined in accordance with the materials of the adhesive layer 11 and the protective layer 12.

The lower limit of the temperature range of the preferable lamination temperature range is preferably 20° C. and is more preferably 40° C. When the temperature range of the preferable lamination temperature range is less than the lower limit as described above, the temperature range where lamination by the cover film 1 for a flexible printed circuit board can be effectively performed is narrow, and therefore the cost of the temperature control or the like may increase. On the other hand, the upper limit of the temperature range of the preferable lamination temperature range is not particularly limited, and may be, for example, 100° C.

Also, it is preferable that the preferable lamination temperature range includes a temperature range of 70° C. or more and 90° C. or less. By the preferable lamination temperature range including the above temperature range, it is possible to perform more effective lamination of the electronic components.

<Flexible Printed Circuit Board>

Figure 3:
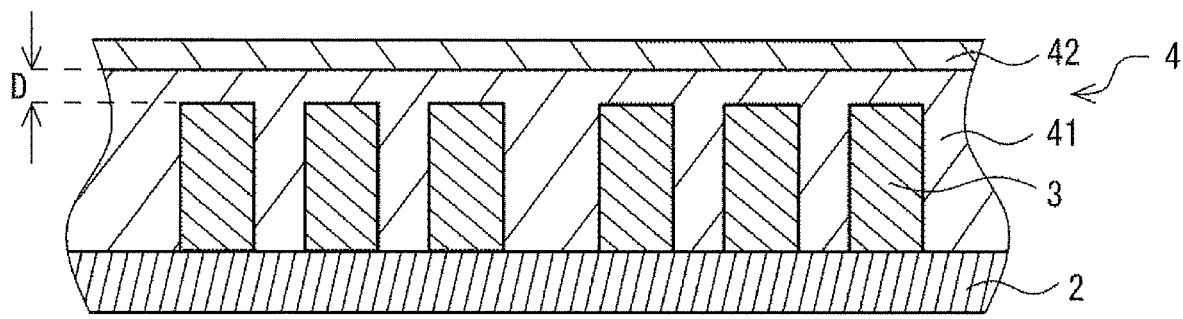
FIG. 3 is a schematic cross-sectional view illustrating a flexible printed circuit board according to one embodiment of the present disclosure.

As illustrated in FIG. 3, a flexible printed circuit board according to one embodiment of the present disclosure includes an insulating base film 2 and a conductive pattern 3 that is layered on one surface side of the base film 2. Also, in the flexible printed circuit board, one surface of the base film 2 or the conductive pattern 3 is covered by a cover film 4 for a flexible printed circuit board according to one embodiment of the present disclosure.

<Base Film>

The base film 2 is a member that supports the conductive pattern 3 and is a structural member that ensures the strength of the flexible printed circuit board. Also, the base film 2 is insulating and flexible.

Examples of the main component of the base film include a soft material such as polyimide, liquid crystal polymer represented by liquid crystal polyester, polyethylene terephthalate, polyethylene naphthalate, polyphenylene ether, or fluoropolymer, a hard material such as paper phenol, paper epoxy, glass composite, glass epoxy, or glass base material, and a rigid flexible material obtained by combining a soft material and a hard material. Among these, polyimide, which is excellent in heat resistance, is preferable. It should be noted that the base film 2 may be porous and may contain a filler, an additive, and the like.

Although the thickness of the base film 2 is not particularly limited, the lower limit of the average thickness of the base film 2 is preferably 5 μm and is more preferably 12 μm. Also, the upper limit of the average thickness of the base film 2 is preferably 500 μm and is more preferably 200 μm. When the average thickness of the base film 2 is less than the lower limit as described above, the strength of the base film 2 may be insufficient. On the other hand, when the average thickness of the base film 2 exceeds the upper limit as described above, the flexibility of the flexible printed circuit board may be insufficient.

<Conduction Pattern>

The conductive pattern 3 constitutes a structure such as an electrical wiring structure, a ground, a shield, or the like. For example, a planar coil element can be formed by the conductive pattern 3. The planar coil element is an element for which the conductive pattern 3 is designed to be relatively thick, and is highly effective to be covered by the cover film 4 for a flexible printed circuit board.

The material that forms the conductive pattern 3 is not particularly limited, as long as it is a conductive material, and may be, for example, a metal such as copper, aluminum or nickel. Typically, copper that is relatively inexpensive and having a high conductivity is used. Also, a plating process may be applied to the surface of the conductive pattern 3.

The lower limit of the average thickness of the conductive pattern 3 is preferably 2 μm, is more preferably 20 μm, and is even more preferably 40 μm. On the other hand, the upper limit of the average thickness of the conductive pattern 3 is preferably 100 μm and is more preferably 70 μm. When the average thickness of the conductive pattern 3 is less than the lower limit as described above, the conductivity of the conductive pattern 3 may be insufficient. Conversely, when the average thickness of the conductive pattern 3 exceeds the upper limit as described above, the flexible printed circuit board may be unnecessarily thickened.

The average width of the conductive pattern 3 is appropriately determined in accordance with the respective structures of the electronic components, the electrical wiring structure, the ground, the shield, and the like. The lower limit of the average width of the conductive pattern 3 is preferably 2 μm and is more preferably 5 μm. On the other hand, the upper limit of the average width of the conductive pattern 3 is preferably 20 μm and is more preferably 15 μm. When the average width of the conductive pattern 3 is less than the lower limit as described above, the conductivity of the conductive pattern 3 may be insufficient. Conversely, when the average width of the conductive pattern 3 exceeds the upper limit as described above, the mounting density of the conductive pattern 3 decreases, and therefore it may be difficult to mount electronic components and the like with high-density.

The lower limit of the average circuit pitch of the conductive pattern 3 is preferably 5 μm and is more preferably 7 μm. On the other hand, the upper limit of the average circuit pitch of the conductive pattern 3 is preferably 20 μm, is more preferably 15 μm, and is even more preferably 10 μm. When the average circuit pitch of the conductive pattern 3 is less than the lower limit as described above, it may be difficult to cover the conductive pattern 3 with the cover film 4 for a flexible printed circuit board. Conversely, when the average circuit pitch of the conductive pattern 3 exceeds the upper limit as described above, the mounting density of the conductive pattern 3 decreases, and therefore it may be difficult to mount electronic components and the like with high-density. It should be noted that the "average circuit pitch of the conductive pattern(s)" refers to, in a case in which conductive patterns are linearly layered with highest density, the distance between the central axes of adjacent conductive patterns.

The lower limit of the aspect ratio of the conductive pattern 3 (ratio of the average thickness to the average width of the conductive pattern 3) is preferably 1 and is more preferably 2. On the other hand, the upper limit of the aspect ratio of the conductive pattern 3 is preferably 5 and is more preferably 4. When the aspect ratio of the conductive pattern 3 is less than the lower limit as described above, the average width needs to be large in order to reduce the resistance of the conductive pattern 3, and therefore it may be difficult to mount electronic components and the like with high-density. Conversely, when the aspect ratio of the conductive pattern 3 exceeds the upper limit as described above, it may be difficult to cover the conductive pattern 3 with the cover film 4 for a flexible printed circuit board.

<Cover Film>

As a cover film of the flexible printed circuit board, the cover film 4 for a flexible printed circuit board is used. The cover film 4 for a flexible printed circuit board includes an adhesive layer 41 and a protective layer 42.

The main components, viscosities, and lamination temperature range of the adhesive layer 41 and the protective layer 42 can be similar to those of the cover film 1 for a flexible printed circuit board illustrated in FIG. 1, and thus the description thereof is omitted.

The average thickness of the adhesive layer 41 is determined such that the conductive pattern 3 is covered. Specifically, the lower limit of the average thickness of the adhesive layer 41 sandwiched between the top surface of the conductive pattern 3 and the protective layer 42 (the average thickness of D in FIG. 3) is preferably 0.1 μm and is more preferably 0.3 μm. On the other hand, the upper limit of the average thickness D of the adhesive layer 41 is preferably 1.5 μm and is more preferably 1 μm. When the average thickness D of the adhesive layer 41 is less than the lower limit as described above, filling the voids between the electronic components with the adhesive layer 41 may be insufficient. Conversely, when the average thickness D of the adhesive layer 41 exceeds the above upper limit as described above, a demand for reducing the thickness of the flexible printed circuit board may not be satisfied.

It should be noted that because the average thickness of the protective layer 42 can be similar to that of the cover film 1 for a flexible printed circuit board illustrated in FIG. 1, the description thereof is omitted.

<Method of Manufacturing Flexible Printed Circuit Board>

A method of manufacturing the flexible printed circuit board includes a layered structure formation step and a lamination step.

<Layered Structure Formation Step>

In the layered structure formation step, a layered structure is formed that includes an insulating base film 2 and a conductive pattern 3 that is layered on one surface side of the base film 2. Specific procedures are described below.

First, a conductive layer is formed on one surface of the base film 2.

The conductor layer can be formed, for example, by adhesion of a foil-like conductor using an adhesive or by known deposition techniques. Examples of the conductor include copper, silver, gold, nickel, and the like. As the adhesive, there is no particular limitation as long as the conductor can be bonded to the base film 2, and various known adhesives can be used. Examples of the deposition techniques include vapor deposition, plating, and the like.

The conductor layer is preferably formed by bonding copper foil to the base film 2 using a polyimide adhesive.

The conductive layer is then patterned to form the conductive pattern 3.

Patterning of the conductor layer can be accomplished by a known method, such as photoetching. Photoetching is performed by forming a resist film with a predetermined pattern on one surface of the conductive layer and then treating the conductive layer exposed from the resist film with an etchant to remove the resist film.

<Lamination Step>

In the lamination step, one surface of the base film 2 or the conductive pattern 3 is covered by the cover film 4 for a flexible printed circuit board. The lamination step includes a superimposition step and a heating step.

(Superimposition Step)

In the superimposing step, for example, on one surface of the base film 2 or the conductive pattern 3 of the layered structure, the cover film 1 for a flexible printed circuit board illustrated in FIG. 1 before being heated is superimposed with the adhesive layer 11 being inward.

(Heating Step)

In the heating step, the cover film 1 for a flexible printed circuit board superimposed on the layered structure in the superimposition step is heated.

The heating temperature in the heating step is set within the lamination temperature range. In a case in which the lamination temperature range includes the preferable lamination temperature range described above, the heating temperature is preferably set within the preferred lamination temperature range. That is, the lower limit of the specific heating temperature is preferably 70° C. and is more preferably 75° C. On the other hand, the upper limit of the heating temperature is preferably 90° C. and is more preferably 85° C. When the heating temperature is less than the lower limit as described above, the adhesive layer 11 may become too viscous, and the voids between the electronic components may not be filled sufficiently. Also, even when the heating temperature is lower than the lower limit as described above, in a case in which the viscosity of the adhesive layer 11 is low, at the time of using the flexible printed circuit board in a high temperature environment, the cover film 4 for a flexible printed circuit board after lamination may soften, and the electronic components may not be sufficiently protected. Conversely, when the heating temperature exceeds the above upper limit as described above, the electronic components may be thermally damaged.

In the heating step, it is preferable to perform pressurization simultaneously with heating. The lower limit of pressure in a case of performing pressurization is preferably 0.1 MPa and is more preferably 0.2 MPa. On the other hand, the upper limit of the pressure is preferably 0.7 MPa and is more preferably 0.6 MPa. When the pressure is less than the lower limit as described above, the effect of pressurization may not be sufficiently obtained. Conversely, when the pressure exceeds the upper limit as described above, the protective layer 42 and the electronic components may be deformed due to the pressure.

The heating time in the heating step is appropriately determined depending on the heating temperature, the viscosity of the adhesive layer 11, and the like. The lower limit of the heating time is preferably 10 seconds and is more preferably 15 seconds. On the other hand, the upper limit of the heating time is preferably 240 seconds and is more preferably 180 seconds. When the heating time is less than the lower limit as described above, the voids between the electronic components may not be sufficiently filled. Conversely, when the heating time exceeds the upper limit as described above, the manufacturing efficiency may decrease.

Advantages

In the cover film 1 for a flexible printed circuit board, the lamination temperature range A, in which the ratio of the viscosity of the protective layer 12 to the viscosity of the adhesive layer 11 is five times or more, is present within the temperature range of 50° C. or more and 150° C. or less. In this lamination temperature range A, the viscosity of the adhesive layer 11 can be reduced while the viscosity of the protective layer 12 of the cover film 1 for a flexible printed circuit board is kept relatively high. Therefore, by using the cover film 1 for a flexible printed circuit board in the lamination temperature range A, voids between the electronic components are easily filled with the adhesive layer 11 with a low viscosity, and the protective layer 12 with a high viscosity remains on the top portion of the electronic components while covering the electronic components. Therefore, it is possible to achieve both covering the electronic component top surface and filling the voids between the electronic components.

Also, in the flexible printed circuit board, electronic components that are configured by the conductive pattern 3 are covered by the cover film 4 for a flexible printed circuit board according to the present disclosure. Therefore, even for the flexible printed circuit board on which electronic components having a high aspect ratio of a circuit wiring are mounted, it is possible to preferably protect the circuit.

Other Embodiments

The embodiment disclosed above should be considered exemplary in all respects and not limiting. The scope of the present disclosure is not limited to configurations of the above described embodiment, but is indicated by claims and is intended to include all changes within the meaning and scope of equivalence with the claims.

Although a case in which the conductive pattern is layered on only one surface of the base film has been described in the above embodiment, the conductive pattern may be layered on both surfaces of the base film. In this case, two cover films for flexible printed circuit boards are layered on both surfaces of the base film. In this case, although the lamination step may be performed for each surface, cover films for flexible printed circuit boards may be superimposed on both surfaces of the base film in the superimposition step and heating may be performed at one time in the heating step.

Although a case in which the conductive pattern formed on one surface of the base film is covered with one cover film for a flexible printed circuit board has been described in the above embodiment, a plurality of cover films for flexible printed circuit boards may be used for one surface of the base film. In this case, it is preferable that, in the superimposition step, a plurality of cover films for flexible printed circuit boards are superimposed so as not to overlap each other. That is, the respective cover films for flexible printed circuit boards cover a conductive pattern at different position. In this manner, by using a plurality of cover films for flexible printed circuit boards, it is possible to selectively cover electronic components that are configured by a conductive pattern.

Also, in a case in which the main component of the adhesive layer and the protective layer of the cover film for a flexible printed circuit board is a photosensitive material, the electronic components that are constructed by the conductive pattern can also be selectively covered by photolithography. Specifically, it is preferable that the method of manufacturing the flexible printed circuit board may further include, as a lamination step, a photolithography step of performing photolithography processing after the heating step.

This photolithography step is performed according to the following procedure. First, a mask corresponding to a portion of the cover film for a flexible printed circuit board to be removed after the heating step is prepared, and ultraviolet rays are emitted through the mask to cure. Next, the masked portion that is not irradiated with ultraviolet rays and that is the uncured portion is dissolved using a developer to be removed. In this manner, by performing the photolithography step, it is possible to cause the cover film for a flexible printed circuit board to remain only a required location and it is possible to selectively cover the electronic components.

DESCRIPTION OF THE REFERENCE NUMERALS 1, 4 cover film for a flexible printed circuit board
11, 41 adhesive layer
12, 42 protective layer
2 base film
3 conductive pattern

The invention claimed is:

1. A cover film for a flexible printed circuit board comprising:
    an adhesive layer containing as a main component a thermosetting binder including an epoxy group as a thermosetting functional group; and
    a protective layer that is layered on a surface of the adhesive layer, the protective layer containing polyimide as a main component,
    wherein a lamination temperature range in which a ratio of a viscosity of the protective layer to a viscosity of the adhesive layer is five times or more and 200 times or less is present within a temperature range of 70° C. or more and 90° C. or less.

2. The cover film for a flexible printed circuit according to claim 1, wherein the adhesive layer and the protective layer contain a photosensitive material as a main component.

3. A flexible printed circuit board comprising:
    an insulating base film; and
    a conductive pattern that is layered on one surface side of the base film,
    wherein one surface of the base film or the conductive pattern is covered by the cover film for a flexible printed circuit board according to claim 1.

* * * * *